United States Patent
Sharon et al.

(10) Patent No.: US 9,158,621 B2
(45) Date of Patent: Oct. 13, 2015

(54) SYSTEM AND METHOD OF COPYING DATA

(75) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 4 days.

(21) Appl. No.: 13/593,107

(22) Filed: Aug. 23, 2012

(65) Prior Publication Data

US 2013/0055047 A1 Feb. 28, 2013

Related U.S. Application Data

(60) Provisional application No. 61/528,381, filed on Aug. 29, 2011.

(51) Int. Cl.
| | | |
|---|---|---|
| G11C 29/00 | (2006.01) | |
| G06F 11/10 | (2006.01) | |
| G11C 29/52 | (2006.01) | |

(52) U.S. Cl.
CPC ............ G06F 11/1068 (2013.01); G11C 29/52 (2013.01)

(58) Field of Classification Search
CPC .......................... G06F 11/1068; G11C 29/52
USPC .................... 714/710, 763, 764; 711/103
See application file for complete search history.

(56) References Cited

U.S. PATENT DOCUMENTS

| | | | |
|---|---|---|---|
| 6,000,006 A | | 12/1999 | Bruce et al. |
| 6,895,464 B2 * | | 5/2005 | Chow et al. .................. 711/103 |
| 7,296,128 B2 | | 11/2007 | Lee |
| 7,925,936 B1 * | | 4/2011 | Sommer ........................ 714/704 |
| 7,958,430 B1 * | | 6/2011 | Kolokowsky et al. ........ 714/763 |
| 2004/0153902 A1 * | | 8/2004 | Machado et al. .............. 714/710 |
| 2006/0203546 A1 * | | 9/2006 | Lasser ....................... 365/185.09 |
| 2008/0068886 A1 * | | 3/2008 | Kang et al. ............... 365/185.09 |
| 2009/0168524 A1 * | | 7/2009 | Golov et al. ............. 365/185.09 |
| 2009/0172498 A1 | | 7/2009 | Shlick et al. |
| 2009/0193058 A1 * | | 7/2009 | Reid ............................. 707/200 |
| 2010/0199019 A1 | | 8/2010 | Fisher |
| 2010/0306456 A1 * | | 12/2010 | Schmidberger ............... 711/103 |
| 2011/0302359 A1 * | | 12/2011 | Schmidberger ............... 711/103 |

OTHER PUBLICATIONS

The International Search Report and Written Opinion mailed Feb. 11, 2013 in International Application No. PCT/US2012/052231, 14 pages.

(Continued)

*Primary Examiner* — Sam Rizk
(74) *Attorney, Agent, or Firm* — Toler Law Group, PC

(57) ABSTRACT

A method of copying data includes receiving a command instructing copying of data from a source location in the memory die to a destination location in the memory die. The method includes determining if a criterion is met, including comparing a predefined parameter to a dynamic threshold. In response to determining that the criterion is met, the method includes executing the copying by moving the data from the source location in the memory die to the controller die and, after moving the data to the controller die, moving an error-corrected version of the data from the controller die to the destination location in the memory die. In response to determining that the criterion is not met, the method includes executing the copying by moving the data inside the memory die source location to the destination location without moving the data to the controller die.

63 Claims, 11 Drawing Sheets

(56) References Cited

OTHER PUBLICATIONS

Invitation to Pay Additional Fees and Partial International Search Report from the International Searching Authority (EP) mailed Nov. 29, 2012 in International Application No. PCT/US2012/052231, 7 pages.

International Preliminary Report on Patentability for International Application No. PCT/US2012/052231, issued Mar. 4, 2014, 8 pages.

* cited by examiner

SYSTEM AND METHOD OF COPYING DATA

CROSS-REFERENCE TO RELATED APPLICATIONS

The present application claims priority to U.S. Provisional Application No. 61/528,381, filed Aug. 29, 2011, which application is hereby incorporated by reference in its entirety.

FIELD OF THE DISCLOSURE

The present disclosure is generally related to copying data in a memory.

BACKGROUND

Non-volatile memory devices, such as universal serial bus (USB) flash memory drives and removable storage cards, provide increased portability of data and software applications. Such devices may copy data from a source location in memory to a destination location in the memory using error detection and correction techniques to remove errors in the copied data. Alternatively, such devices may copy data from the source location to the destination location without using error detection and correction during the copy operation. Copying data without using error detection and correction reduces copy latency but increases a risk that the data becomes unrecoverable due to too many errors accumulating in the data. Therefore, it would be beneficial to improve an average speed of data copying within a non-volatile memory device while maintaining an acceptably low risk that the data becomes unrecoverable due to accumulated errors.

SUMMARY

A determination is made whether a copy of data from one memory location to another is to be performed via a full copy procedure that includes error detection and correction of the data or via a "copy-back" procedure that does not correct errors that may have accumulated in the data. The determination may be based on comparing one or more predefined parameters to one or more thresholds. Predefined parameters may include a count of expected errors in the data, a count of write/erase cycles of a first group of storage elements that store the data prior to copying, a count of write/erase cycles of a second group of storage elements that the data is copied to, or a time elapsed since the data was programmed to the first group of storage elements, as illustrative examples. Thresholds may be dynamically computed, such as based on an age of a memory device and a number of write/erase cycles of a source location or of a destination location, as illustrative examples. A determination of whether to perform a full copy or a copy-back may be based on whether metadata indicates that the data has a high importance or may be based on whether metadata indicates that the data should be read using a high-resolution read mode.

DETAILED DESCRIPTION

Figure 1:
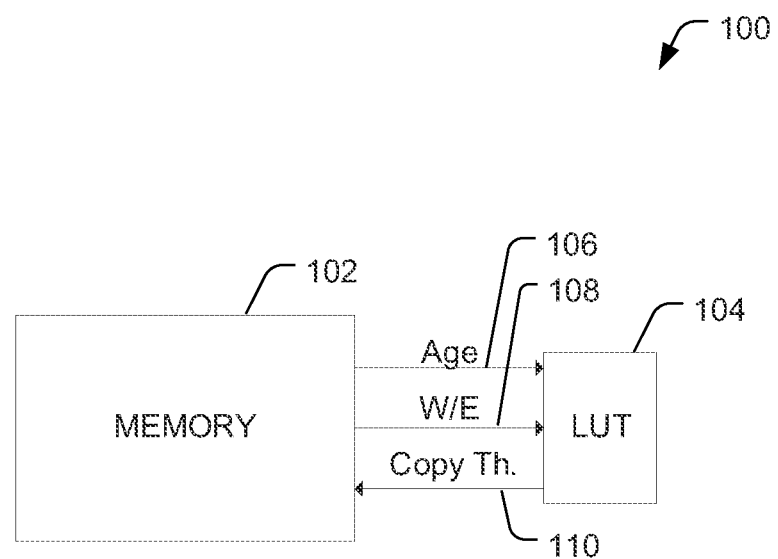
FIG. 1 is a block diagram of a first embodiment of a system that includes a memory and a lookup table to determine a dynamic copy-threshold.

"Copy-back" refers to an operation in which a page of data is copied from a first physical address in a memory, such as a flash die, to a second physical address in the flash die without sending the data out of the flash die. Page copying operations may be performed in flash management systems, such as during garbage collection, and include moving a page of still-valid user data to a new location. A flash die may support commands for performing a copy-back operation to move data between two physical locations without sending the data out of the flash die. Flash management systems that manage flash devices that support commands for performing a copy-back operation may not use the flash die's internal copy-back operation for moving data during garbage collection. Instead, page copy operations between locations (e.g. physical pages) in a flash memory array may be carried out by:

a) Reading data from a source physical page in the flash array into a flash die data register;

b) Moving the data from the data register out of the flash die over a bus that connects the flash die to a flash controller;

c) Checking the data for errors and correcting any errors at the flash controller;

d) If any errors were corrected, sending the corrected data from the controller over the bus to the flash die data register; and e) Programming the data from the data register into a destination location in the flash array.

The above procedure consumes bus cycles when moving the data over the bus to the controller from the flash die. However, sending the data to the controller enables correction of errors that may have accumulated in the data after the data was programmed in the flash die.

User data stored in a flash page may be accompanied by error correction parity bits that enable correction of detected errors in the data. When copying a page according to the above procedure, any errors accumulated in the original location of the data are corrected in the controller and the data is reset to its original (correct) version. However, if an internal copy-back method is used instead for copying the data, no error correction occurs. If the copied data has accumulated errors prior to being copied using the internal copy-back operation, then the version of the data in the new location also includes those errors. Later, when the data is moved again by flash management software, additional errors may have accumulated in the data. There is no limit to this accumulation of errors as long as the data is not deleted or over-written. At some point the number of errors in the data may exceed the capability of the controller's error correction mechanism to correct the errors, at which point the data becomes corrupted and may be lost. Relying on internal die copy-back operations when moving data between physical locations within a flash array may therefore be dangerous and may end up with uncorrectable data loss.

Further, control fields may be associated with user data and stored with the user data. Control fields may depend on the physical address of the user data and may therefore change when the user data is moved between two physical addresses. In flash management systems using such control fields, a simple copy-back implementation of the user data may also include updating the control fields by the flash controller executing the flash management algorithms while the data remains in the data register of the flash die.

A memory device may be configured to move data with a copy-back command based on a value of a counter corresponding to the data as compared to a predetermined limit. When the counter is below the predetermined limit, the counter is incremented and data from the block of data is moved using a copy-back command. When the counter reaches the predetermined limit, the counter is reset and data from the block of data is moved to system memory (e.g. memory at the controller) and examined for errors. Once any errors are corrected, the data is transferred back to the non-volatile memory.

However, setting a predetermined limit to the number of copy-backs may have several drawbacks. A limit that is set for a fresh flash memory device (that may have a relatively low expected error rate) will result in data loss when applied to a flash memory device that has experienced many write/erase (W/E) cycles over a period of time and that has a relatively higher expected error rate. On the other hand, a limit that is set for an aging flash memory device will be too pessimistic for a fresh memory device and will result in unnecessary error correction operations.

Another drawback of comparing a single parameter (i.e. a count of the number of copy-backs performed since the last full copy) to a predetermined limit is that other parameters of the memory are ignored. As described herein, in some embodiments other parameters of the memory may be used instead of, or in addition to, a count of the number of copy-backs since the last full copy.

A memory system may include a memory array connected to a controller via an external bus. Physical addresses within the array may be connected via internal buses that provide a faster speed of data transfer than the external bus. However, data transfer via the internal buses may not provide error correction capability. If a copy-back operation is performed, errors may accumulate in the copied data. If a copy procedure is carried out via the controller, errors in the data are corrected and the memory may be programmed with data (e.g. a code-word) that is free of errors. However, the copy procedure via the controller may introduce greater latency than the copy-back operation.

A decision whether to perform a fast copy-back operation or a full copy operation may be based on whether one or more criteria are satisfied. If the one or more criteria are satisfied then a full copy operation may be performed. The full copy operation includes copying the data from a source location in a memory die to an external controller, performing error correction on the data, and copying corrected data to a destination location in the memory die. The criteria may include one or more of:

a number of expected errors in the data exceeds an error-threshold;

a number of write/erase cycles of the source location exceeds a source-write/erase-threshold;

a number of write/erase cycles of the destination location exceeds a destination-write/erase-threshold;

a time elapsed since the data was programmed to the source location exceeds a source-data-retention-threshold;

meta-data associated with the data indicates that the data should be read with error correction (e.g. because the meta-data indicates a high importance of the data or that data requires a longer data retention specification); or a reading mode of the data requires a full copy operation (e.g. the reading mode indicates reading with high resolution. i.e. reading with additional soft bits as opposed to reading with only hard bits), as illustrative, non-limiting examples.

Each of the above criteria may be considered by itself as a sole criterion to determine whether a data copy operation is to be performed via a copy-back operation or via a full copy operation. Alternatively, a combination of two or more of the criteria may be used to determine whether a data copy operation is to be performed via a copy-back operation or via a full copy operation.

Alternatively, or in addition, one or more dynamically computed thresholds for criteria may be used for deciding whether to perform a full copy procedure or a fast copy-back procedure. An example of such a criterion may be that a number of copy-backs since a last full copy exceeds a dynamically computed copy-back threshold. If the criterion is satisfied, i.e. the number of copy-backs since the last full copy exceeds the dynamically computed copy-back threshold (and a command to move data from a source location to a destination location has been received), then a full copy procedure may be carried out including copying the data to the controller, decoding the data into decoded data (including correction of any errors in the data), and encoding the decoded data to form a new code-word that is free of errors. The new code-word may then be programmed to the destination location. Otherwise, if the criterion is not satisfied, i.e. the threshold has not been exceeded, a copy-back operation may be performed from the source to the destination inside the memory die.

Examples of a parameterized criterion may include:

a number of copy-back operations since last full copy is larger than a dynamically set parameter copy-threshold;

a number of expected errors in the data exceeds a dynamically set parameter error-threshold;

a number of write/erase cycles of the source location exceeds a dynamically set parameter source-write/erase-threshold;

a number of write/erase cycles of the destination location exceeds a dynamically set parameter destination-write/erase-threshold; or a time elapsed since the data was programmed to the source location exceeds a dynamically set parameter source-data-retention-threshold, as illustrative, non-limiting examples. Any other combination of one or more of the criteria may be used.

Another example of slightly more complex criteria may be that the number of parity bits in a code-word is less than a parity-threshold, and a number of copy-back operations of the code-word since a last full copy of the code-word is higher than a copy-threshold. Note that some embodiments of the present disclosure may include the data source being a first type of flash memory and the data destination being a second type of flash memory. For example, a data copy may be performed from a source having single-level cell (SLC) flash memory type to a destination having a multi-level cell (MLC) flash memory type, from a MLC source to an SLC destination, from a MLC source to a tri-level cell (TLC) destination, from a tri-level cell (TLC) source to a MLC destination, etc. Further, assuming an error correction coding (ECC) scheme used by a memory system is capable of using reliability measures attributed to read bits, then at least some cases (e.g. from a MLC source to a MLC destination or from a TLC source to a TLC destination) allow a larger number of copy-back operations before data is extracted to the controller since in these cases the multi-state error are more limited as compared with SLC-to-TLC copy-back operations. For example, with an SLC-to-TLC copy-back operation, if an error has occurred in more than one SLC page then the "jump" in TLC state may be substantial (e.g. a multi-state transition). Such a jump may not be observed by a read mechanism that compares the read threshold to the nearest state in the memory and hence may reduce the reliability of the read data.

Various parameters may be computed as functions of a status of a memory. FIG. 1 illustrates a particular embodiment of a data storage system 100 that includes a memory 102 and that implements a lookup table (LUT) 104. Indices to the LUT 104 are associated with status of the memory 102, illustrated as a device age 106 and a count of write/erase (W/E) cycles 108. Entries of the LUT 104 include values of the parameter to be computed, illustrated as a value of a copy-threshold parameter 110.

Figure 2:
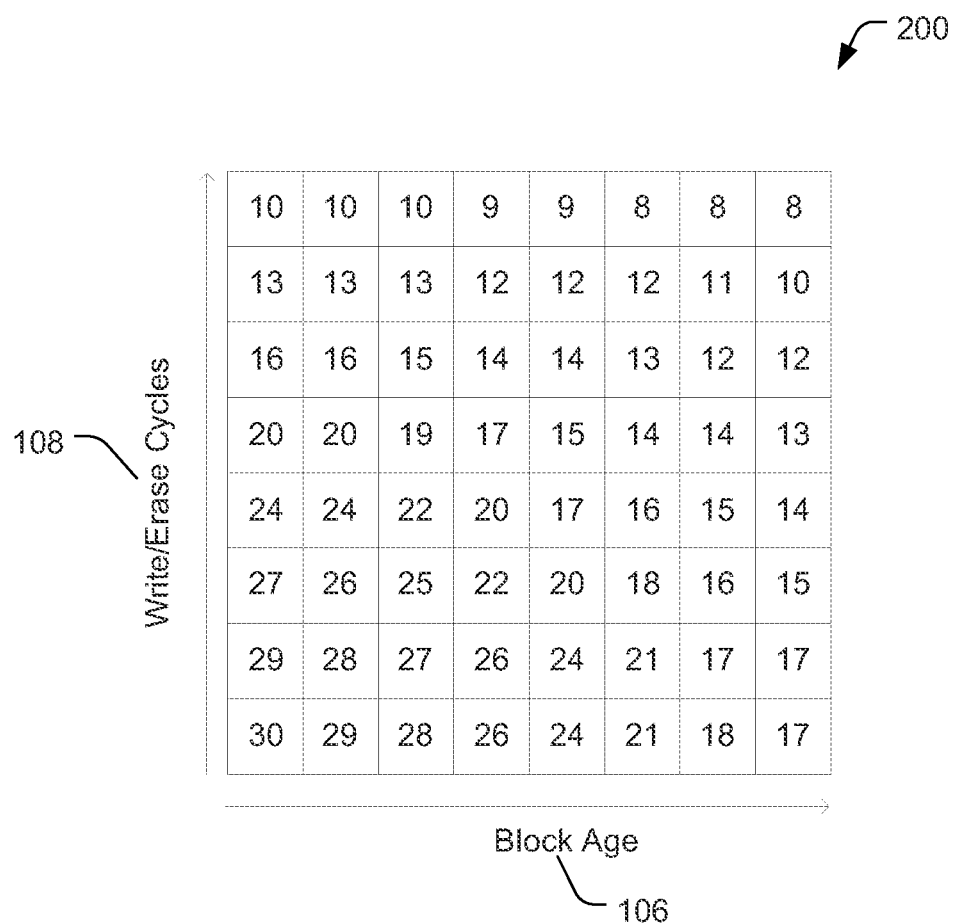
FIG. 2 is a general diagram of an embodiment of the lookup table of FIG. 1.

For example, a copy-threshold parameter may be determined by looking at a two-dimensional LUT where the indices to the LUT are the age of the block (i.e. some measure proportional to the time that has elapsed since the block was programmed) on one dimension of the LUT and the number of write/erase cycles on the second dimension of the LUT. For each combination of age and write/erase cycles there may be a corresponding copy-threshold. A fresh device (e.g. having a low value of a device age parameter) may receive a relatively large copy-threshold allowing for many copy-back operations, while an aging device with many write/erase cycles may receive a low copy-threshold allowing for fewer copy-back operations. FIG. 2 is an illustration of a LUT 200 that can be used to compute or determine a copy-back threshold. For example, the LUT 200 may be used as the LUT 104 of FIG. 1. Values illustrated in the entries of the LUT 200 are provided for illustration purposes and may not represent actual values. A fresh memory device may have a low value of W/E cycles (e.g. a "0" age value). The LUT 200 may provide a largest stored copy-back threshold for such a device (i.e. the value "30" in the lower-left entry of the LUT 200). Entries of the LUT 200 that are horizontally to the right of the lower-left entry in the illustration of the LUT 200 correspond to the same write/erase value (e.g. "0") but increased block age (i.e. increased time that has elapsed since block programming) and have smaller values of the copy-back threshold as the block age increases. Moving upward among entries of the LUT 200 corresponds to an increase in the number of write/erase cycles and a reduced value of the copy-back threshold.

Although FIGS. 1-2 illustrate determining a copy-threshold using a LUT, in other embodiments a copy-threshold may be computed according to real-time or near real-time parameters of a memory system. For example, a method for computing a copy-back threshold of a memory system for a given encoding scheme may include:

a. setting an initial copy-back threshold;

b. operating the memory system with the copy-back parameter set to an initial copy-back threshold;

c. generating a histogram using current and historical data of each time the copy-back threshold has been reached and data has been sent to the controller, the histogram based on the number of corrected errors in each code-word; and d. updating the copy-back threshold as a function of the histogram.

Alternatively, a full histogram may not be generated. Instead, a maximal number of errors that have been detected within a code-word during a decoding process may be used. If the maximal number of detected errors is smaller than the error correction capability of the encoding scheme by at least a first predefined number, then the copy-back threshold may be increased. If the maximal number of errors is not smaller than a second predefined number (which may be slightly less than the error correction capability of the encoding scheme), or if there were uncorrected errors during a code-word decoding process, then the copy-back threshold may be decreased.

Optionally, a memory controller may track an accumulated number of errors detected by the decoder in a given time period, and the copy-back threshold may be updated as a function of the accumulated number of errors.

Figure 3:
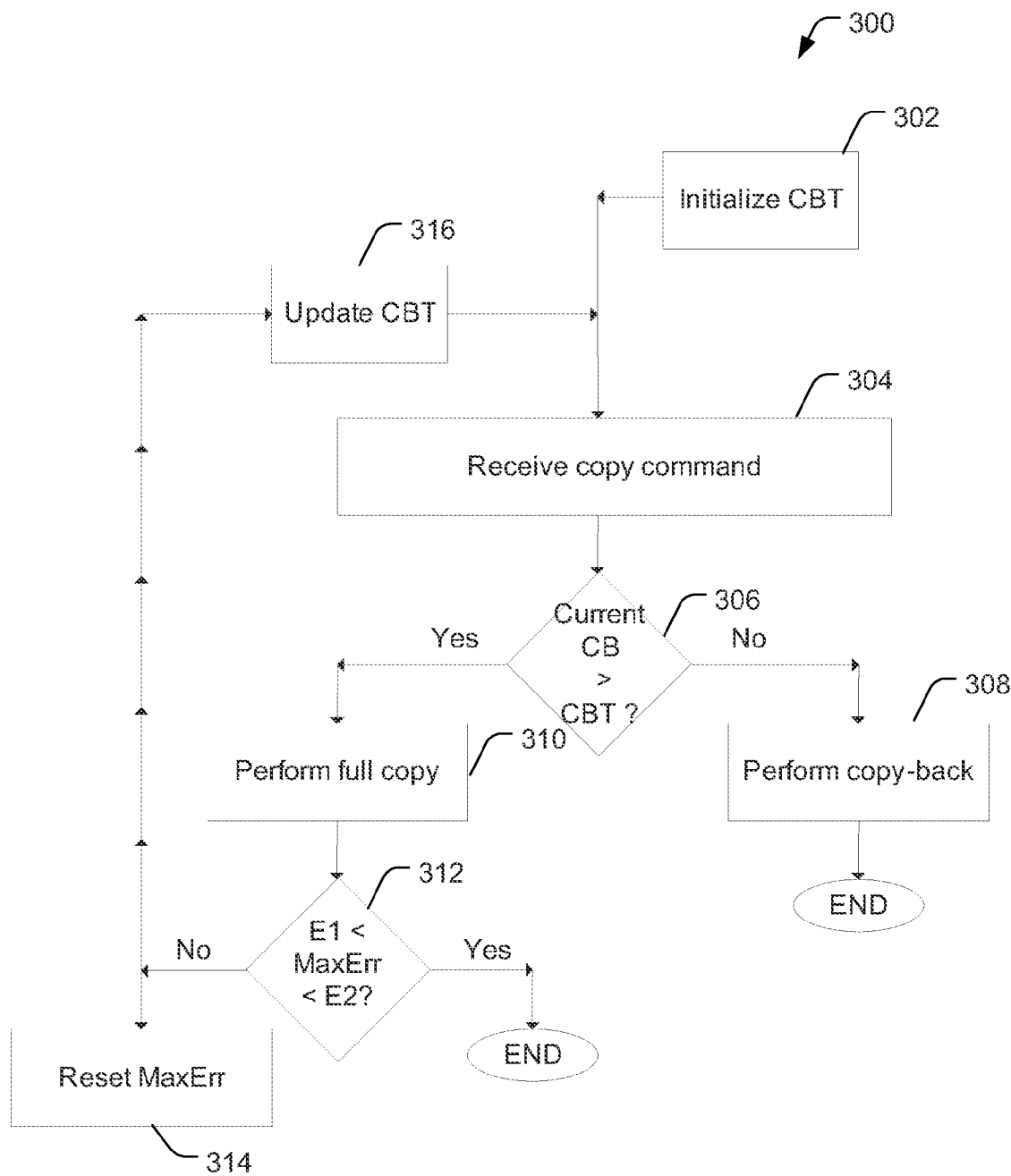
FIG. 3 is a flow chart of a first particular embodiment of a method of determining whether to perform a full copy or a copy-back.

FIG. 3 depicts a method 300 of determining whether to perform a full copy or a copy-back. The method 300 may be performed at a data storage device that includes a memory (e.g. a flash memory) coupled to a controller that includes an error correction coding (ECC) engine having an ECC decoder, such as described with respect to FIG. 6. A copy-back-threshold variable (CBT) is initialized to some initial value, at 302. In response to receiving a copy command (e.g. from a host device) to copy data, at 304, the value of a copy-back counter (CB) is compared to CBT, at 306. If CB is not larger than CBT, then a copy-back operation is performed, at 308. If CB is larger than CBT, then a full copy is performed, at 310. The full copy procedure includes transferring the data to the controller and performing ECC decoding on the data.

The controller may hold statistics regarding the number of errors which were corrected by the ECC decoder. For example, the statistics may be in the form of an accumulated number of errors or may include a full histogram of the number of corrected errors in the decoded codewords. As illustrated in FIG. 3, the controller may store a single number which is the maximal number of errors which were corrected in any single code-word (during some period of time). A determination is made, at 312, whether this maximal number of detected errors during the time period, denoted as MaxErr, is greater than a first threshold (E1) and less than a second threshold (E2). If MaxErr is between E1 and E2, the method 300 terminates without updating CBT.

If MaxErr is determined to be smaller than E1, at 312, CBT may be increased, at 316. CBT may be increased so that a greater number of copy-backs are performed on copied data between each full copy of the data, to reduce overall latency of copy operations. Because a largest detected number of accumulated errors (i.e. MaxErr) is much smaller than an error correction capability of the ECC decoder (indicated by MaxErr<E1), one or more additional copy-backs performed between full copies may have a very low probability of allowing a sufficient number additional errors to accumulate in the data to render the data uncorrectable by the ECC decoder. Alternatively, if MaxErr is determined to be larger than E2, at 312, and E2 is close to the error correction capability of the ECC decoder, then CBT is decreased, at 316.

In addition to updating CBT, at 316, the parameter MaxErr is reset, at 314, so that the next update will be based on the performance of the system after updating CBT.

Figure 4:
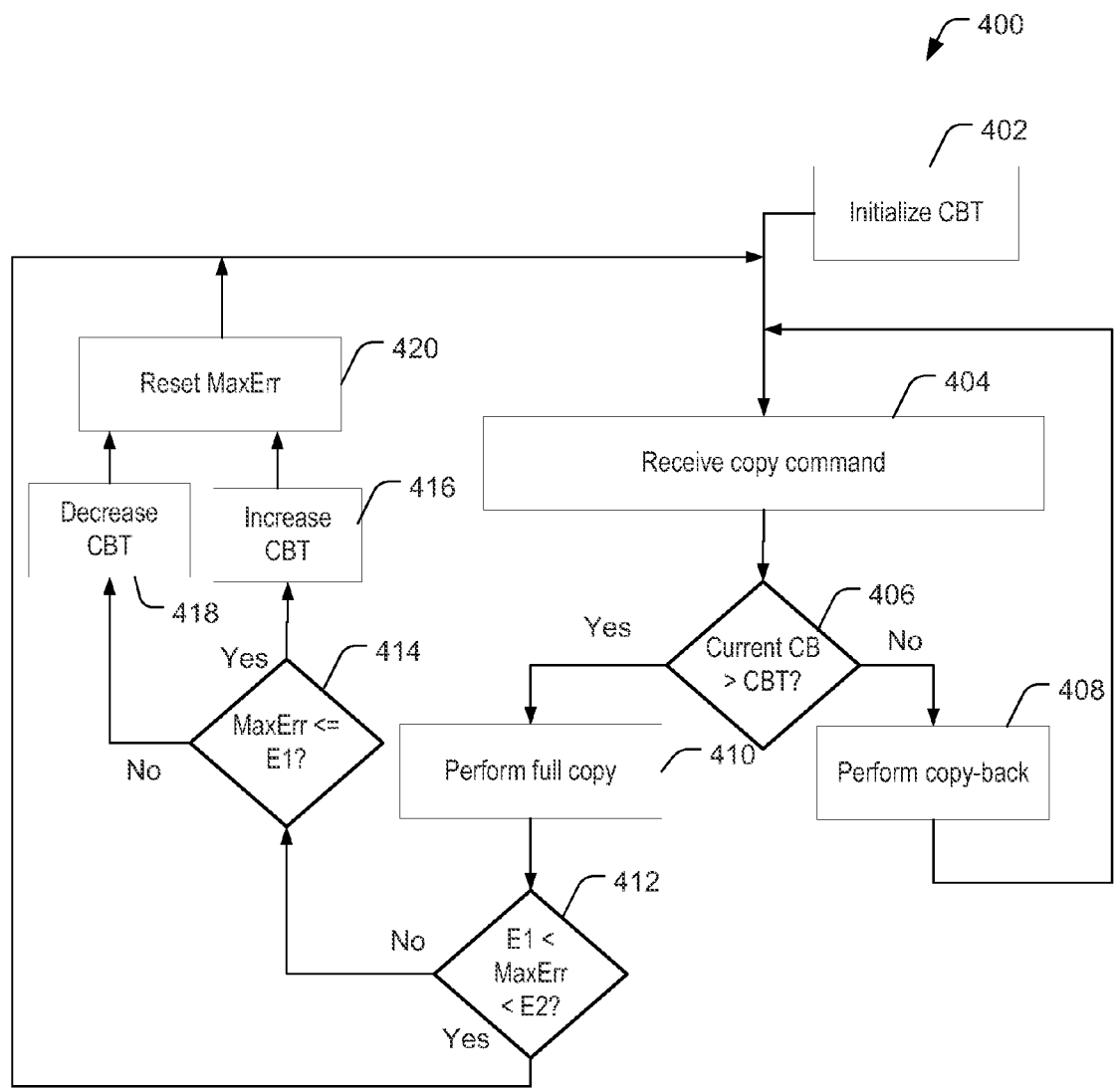
FIG. 4 is a flow chart of a second particular embodiment of a method of determining whether to perform a full copy or a copy-back.

FIG. 4 illustrates a method 400 that is similar to the method 300 of FIG. 3. The method 400 does not end after a single iteration; rather the method 400 has a continuous loop structure for receiving new copy commands. In the method 400, CBT is updated when a value of MaxErr is less than E1 or greater than E2.

The method 400 includes initializing CBT, at 402, and receiving a copy command, at 404. A determination is made whether a current CB is greater than CBT, at 406. In response to the current CB not being greater than the CBT, at 406, a copy-back is performed, at 408, and processing returns to 404. Alternatively, in response to the current CB being less than the CBT, at 406, a full copy is performed, at 410.

After performing the full copy, at 410, a determination is made whether a value of MaxErr is between E1 and E2, at 412. In response to the value of MaxErr being between E1 and E2, at 412, processing returns to 404. Otherwise, in response to the value of MaxErr not being between E1 and E2, at 412, a determination is made whether MaxErr is less than or equal to E1, at 414. In response to MaxErr being less than or equal to E1, at 414, CBT is increased, at 416. Otherwise, in response to MaxErr not being less than or equal to E1, at 414, CBT is decreased, at 418. After updating CBT (at 416 or at 418), MaxErr is reset, at 420, and processing returns to 404.

In other embodiments, the method 400 may modified such that CBT will be updated only after multiple full copy operations have been performed, rather than after each full copy operation is performed. The parameter to be considered may be a different parameter than the copy-back counter (CB) illustrated in FIG. 4. In place of MaxErr (representing the maximal number of errors which were detected by the ECC decoder) other embodiments may use an average number of errors, a median of the number of errors, or any other parameter whose value may depend on the value of the CBT.

Another option for real time computation of the copy-threshold includes:

a. estimating the bit error probability $p_e$ introduced by a single copy-back operation (e.g. by measuring the number of bits flipped by the decoder during a full copy operation that occurs after a single copy-back operation);

b. estimating a largest number k such that the bit error probability introduced after k copy-back operations does not exceed a desired bit error probability $P_1$ (determined as a function of the error correction capability of the controller's ECC engine); and c. setting a copy-threshold to the largest number k.

An estimate of the largest number k may be computed by, assuming that $p_e$ does not change significantly during a period of k copy-backs. The bit error probability after k copy-backs is given by $$1 - \sum_{i=1,3,5,\ldots,k} \binom{k}{i} p_e^i \cdot (1-p_e)^{k-i} \cong 1 - (1-p_e)^k.$$

Therefore k the can be computed as:

$$k \cong \lfloor \log(1-P_1)/\log(1-p_e) \rfloor$$

where $\lfloor x \rfloor$ denotes the largest integer which is not greater than x.

Another embodiment includes a method for computing an encoding scheme for a given copy-back threshold, the method comprising:

a. setting an initial coding scheme;

b. operating a memory system with the coding scheme set to the initial coding scheme;

c. generating a histogram of a number of errors corrected by the controller in a single code-word each time a predetermined copy-back threshold has been reached and data was sent to the controller for error correction; and d. updating the coding scheme as a function of the histogram.

As an alternative to generating a full histogram, information indicating a maximal number of errors in a single code-word which occurred during a decoding process may be stored and used to update the coding scheme. If the maximal number of errors is smaller than the error correction capability of the code used by the coding scheme by at least a first predefined number, then the coding scheme may be updated to a coding scheme with a larger code rate (i.e. the coding scheme uses less redundancy). If the maximal number of errors is not smaller than a second predefined number (which may be slightly less than the error correction capability of the code), or if there were uncorrected errors during the decoding process, then the coding scheme may be updated to a coding scheme with a smaller code rate (i.e. the coding scheme uses more redundancy).

Updating the coding scheme can include switching between coding schemes that belong to the same "family" of codes. For example a single long code with a small code rate (large redundancy) may be used as a default code. After encoding by the code, the code-word may be punctured and the punctured code-word may be saved in the memory. The amount of puncturing can be a function of the copy-back threshold and the status of the memory (e.g. memory age, number of write/erase cycles, one or more other parameters, or any combination thereof).

Other variants may include updating both the copy-back threshold and the coding scheme concurrently. For example, if the maximal number of errors corrected by the ECC (in a single code-word) was very small, then both the copy-back threshold may be increased and the coding scheme may be updated to code with larger code rate. On the other hand, if uncorrected errors appeared in the decoder then the copy-back threshold may be decreased and concurrently the coding scheme may be changed to a code with smaller code-rate.

Other embodiments of the present disclosure may update other parameters, such as a number of expected errors in the data, a number of write/erase cycles of the source location, or a number of write/erase cycles of the destination location, as illustrative examples.

A number of expected errors in the data may be closely related to the coding scheme that is used and a dynamic computation of a number of expected errors in the data may be very similar to the computation of the coding scheme. Statistics may be gathered about the number of errors that have been corrected by the decoding scheme and the statistics may be used to compute the expected number of errors.

Updating a number of write/erase cycles for either the source or the destination can be straightforward. The number of write/erase cycles for the source and number of write/erase cycles for the destination (together or individually) may be used in order to update a copy-back threshold or a coding scheme used by a memory device.

A global copy-back threshold may be used for an entire memory device. However, under certain circumstances local parameters may be used, such as a number of write/erase cycles for the source location and/or for the destination location.

In some embodiments, a memory array may include circuitry for computing one or more functions. A decision whether to perform a copy-back procedure or a full copy procedure may depend on values of the functions.

For example, circuitry to compute a syndrome of a codeword (e.g. an indication of a number of unsatisfied parity check equations) can be implemented in a memory array or otherwise on a memory die (i.e. a flash memory die that may be coupled to a controller die). When a copy command is received to copy data from a source location to a destination location in the memory array, the syndrome of the codeword at the source location may be computed within the memory die. If the syndrome weight exceeds a threshold (either predetermined or dynamically computed), then a full copy procedure may be performed including transferring the codeword to the controller and performing a full ECC decoding to correct all errors. If the syndrome weight is small a copy-back procedure may be carried out instead.

Figure 5:
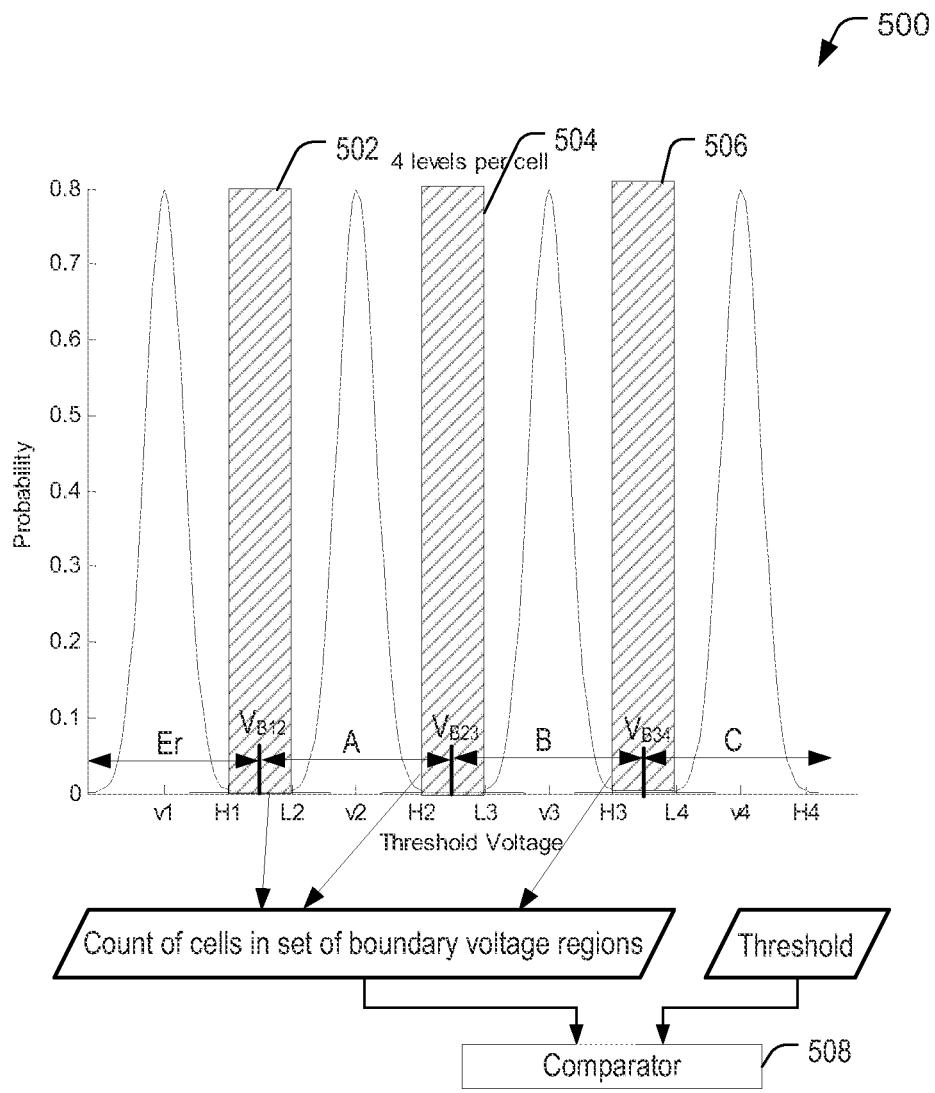
FIG. 5 is a general diagram illustrating a set of state boundary voltage regions for determining whether to perform a full copy or a copy-back based on a count of cells in the state boundary voltage regions.

FIG. 5 is a general diagram illustrating a set of state boundary voltage regions for determining whether to perform a full copy or a copy-back based on a count of cells in the state boundary voltage regions. A graph 500 illustrates a voltage distribution in a group of memory cells showing a distribution of threshold voltage for different states of the memory cells. The center of the distribution for each state is denoted by v*, (where * is one of the numbers 1, 2, 3, or 4). To the right of v* a high threshold voltage point is marked as H* (H for high), and to the left a low threshold voltage point is marked as L* (L for low). Any threshold voltage which was read between L* and H* can be associated with v* with a high level of confidence. Voltage thresholds that are to the right of H* and to the left of L(*+1) are hard to decide whether to be associated with v* or v(*+1). Each interval the right of H* and to the left of L(*+1) is illustrated as a state boundary voltage region (i.e. a voltage region that includes a boundary between states of the memory cell). A first state boundary voltage region 502 spans from H1 to L2 and includes a voltage $V_{B12}$. $V_{B12}$ is a transition voltage that identifies a boundary between state 1 (state "Er") and state 2 (state "A"). A second state boundary voltage region 504 spans from H2 to L3 and includes a transition voltage $V_{B23}$ that identifies a boundary between state 2 (state "A") and state 3 (state "B"). A third state boundary voltage region 506 spans from H3 to L4 and includes a transition voltage $V_{B34}$ that identifies a boundary between state 3 (state "B") and state 4 (state "C"). The set of intervals between H* and the following L(*+1) (i.e. the set of boundary voltage intervals 502, 505, and 506) may be denoted as "FZ". In the example illustrated in FIG. 5, the FZ includes the intervals between H1 to L2, H2 to L3, and H3 to L4 (FZ=[H1, L2]∪[H2, L3]∪[H3, L4]).

The programming of each of the four states may be designed such that a cell in the erased state will be charged such that its threshold voltage is centered around v1, a cell in state A will be charged such that its threshold voltage is centered around v2, a cell in state B will be charged such that its threshold voltage is centered around v3, and a cell in state C will be charged such that its threshold voltage is centered around v4. As time progresses and data is moved around, the voltage distribution may not be as sharp as depicted in FIG. 5. For example, during copy-back processes a cell which was originally programmed to state A may be programmed such that its threshold voltage is now to the right of H2 (and thus may be associated with state B), or to the left of L2 (and thus may be associated with an erased state (Er)).

A memory array may include circuitry to detect threshold voltages of cells that reside in the FZ. When a copy command is received to copy data from a group of storage elements (e.g. flash memory cells), a count of cells having threshold voltages within the set of state boundary voltage regions 502, 504, and 506 (i.e. in the FZ) may be computed. If the count exceeds a FZ-threshold (either predetermined or dynamically computed), illustrated in FIG. 5 as comparing a count of cells in the set of boundary voltage regions to a threshold via a comparator 508 on the memory die, then a full copy procedure may be performed including transferring the codeword read from the group of storage elements to the controller and performing a full ECC decoding to correct all errors. If the count does not exceed the FZ-threshold a copy-back procedure may be carried out, without controller involvement. When a full copy is carried out and the codeword is programmed again into the memory, then a full programming sequence (known as program/verify) may be performed to ensure that the threshold voltages are concentrated towards the centers of the cell states voltage window.

In other embodiments, the memory die may include other circuitry to implement functionality instead of, or in addition to, syndrome computation and/or counting cells with threshold voltages within a set of state boundary voltage regions. The memory die may also include circuitry to compute inside the memory whether the conditions for copy-back are satisfied without reference to the controller.

Figure 6:
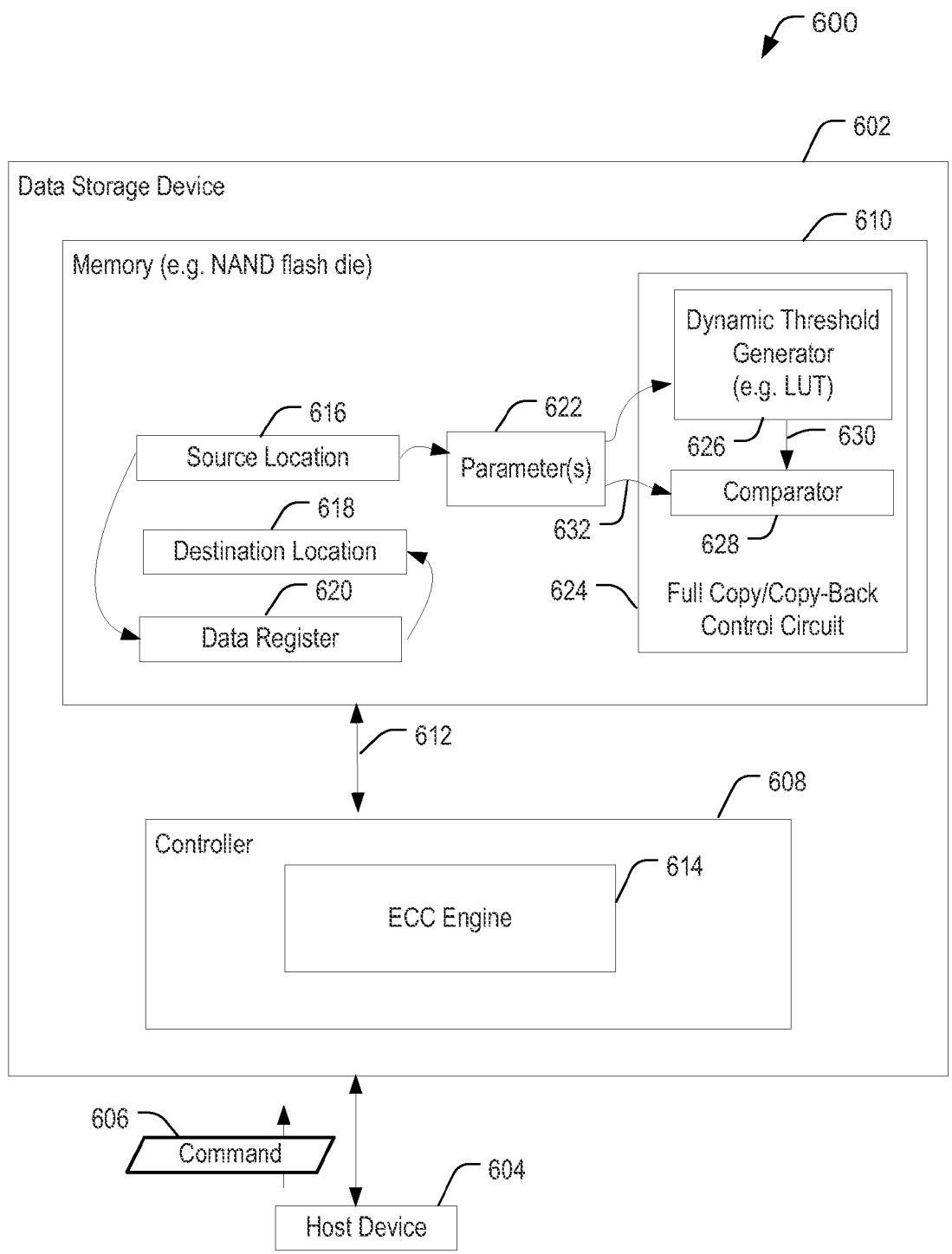
FIG. 6 is a block diagram of a system including a first embodiment of a full copy/copy-back control circuit configured to select a full copy or a copy-back based on a dynamic threshold.

FIG. 6 depicts a system 600 including a data storage device 602 that is operatively coupled to a host device 604. The data storage device 602 includes a controller 608 with an ECC engine 614. The controller 608 is coupled to a memory 610, such as a NAND flash die, via a bus 612. The memory 610 includes a full copy/copy-back control circuit 624 that is configured to select a full copy or a copy-back based on a dynamic threshold.

The data storage device 602 may be a memory card, such as a Secure Digital SD® card, a MicroSD® card, a MiniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 602 may be embedded memory in the host device 604, such as eMMC® (trademark of JEDEC Solid State Technology Association, Arlington, Va.) and eSD, as illustrative examples.

The host device 604 may be a device that is configured to be operatively coupled to the data storage device 602, such as a mobile telephone, a music or video player, a personal digital assistant (PDA), a gaming device, an electronic-book reader, a camera, a computer (such as a laptop or notebook computer), any other electronic device, or any combination thereof. The host device 604 is configured to send instructions to the data storage device 602, such as a command 606 instructing copying of data from a source location 616 in the memory 610 to a destination location 618 in the memory 610.

The controller 608 is configured to receive messages, such as the command 606, from the host device 604. The controller 608 is configured to respond to requests for read access or requests for write access to the memory 610. For example, the controller 608 is configured to retrieve data from the memory 610 that is requested by the host device 604 and to initiate sending requested data to the host device 604. The controller 608 may also be configured to perform memory management operations, such as garbage collection. The controller 608 may be configured to instruct the memory 610 to copy data from the source location 616 to the destination location 618 without receiving any copy commands from the host device 604.

The memory 610 may be a NAND flash die having one or more memory arrays. The source location 616 includes a group of storage elements, such as a word line of flash memory cells. The destination location 618 may also include a group of storage elements, such as a word line of flash memory cells. For example, storage elements in the source location 616 or the destination location 618 may be configured to operate as single-level cell (SLC) storage elements that store a single bit per cell or as multi-level cell (MLC) storage elements that store more than one bit per cell.

The memory 610 may be configured to initiate a copy operation by reading data from the source location 616 and storing the read data to a data register 620. For copy-back operations, the data may be written from the data register 620 to the destination location 618. For full copy operations, data in the data register 620 may be sent via the bus 612 to the controller 608, where an ECC decoding operation may be performed at the ECC engine 614. The memory 610 receives error information from the controller 608. For example, the memory 610 may receive from the controller 608 an indication of locations of errors detected in the data (if any) and may correct the data in the data register 620. As another example, the memory 610 may receive an error-corrected version of the data from the controller 608 and may overwrite the data in the data register 620. The memory 610 may then copy the error corrected version of the data from the data register 620 to the destination location 618.

The memory 610 is configured to determine whether to perform a copy-back or a full copy based on an output of the full copy/copy-back circuit 624. The full copy/copy-back circuit 624 may receive one or more parameters 622. One or more of the received parameters 622 may be provided to a dynamic threshold generator 626 to generate one or more dynamic thresholds 630. One or more of the received parameters 622 may be provided to a comparator 628 for comparison to the one or more dynamic thresholds 630. A result of the comparison may be used to determine whether to perform a copy-back or a full copy.

The full copy/copy-back circuit 624 enables the memory 610 to determine if a full copy/copy-back criterion is met. Determining if a full copy/copy-back criterion is met can include comparing a predefined parameter 632 to a dynamic threshold 630. In response to determining that the criterion is met, the memory 610 may execute the copying by moving the data from the first group of storage elements at the source location 616 in the memory die to the controller 608 at a controller die. After moving the data to the controller die, an error-corrected version of the data may be moved from the controller die to the second group of storage elements at the destination location 618 in the memory die. In response to determining that the criterion is not met, the memory 610 may execute the copying by moving the data inside the memory die from the first group of storage elements to the second group of storage elements without moving the data to the controller die. Determining whether the criterion is met can also include comparing a second predefined parameter 632 to a second dynamic threshold 630. Any number of parameters may be used to determine whether the criterion is met.

The one or more predefined parameters 632 may be any of the parameters described with respect to FIGS. 1-5. As an example, the predefined parameter 632 may be a count of expected errors in the data, as described in further detail with respect to FIG. 7. As other examples, the predefined parameter 632 may be a count of write/erase cycles of the first group of storage elements at the source location 616, a count of write/erase cycles of the second group of storage elements at the destination location 618, a time elapsed since the data was programmed to the first group of storage elements at the source location 616, a count of copy-back operations that have been applied to the data since applying a most recent error correction operation to the data, a count of parity bits in the data, one or more other parameters, or any combination thereof, as illustrative, non-limiting examples.

The dynamic threshold 630 may be determined at least partially based on one or more parameters described with respect to FIGS. 1-5. For example, the dynamic threshold 630 may be determined at least partially based on a count of copy-back operations that have been applied to the data since applying a most recent error correction operation to the data, a count of write/erase cycles of the first group of storage elements, a count of write/erase cycles of the second group of storage elements, a count of errors in the data detected during a previous copy of the data via the controller die, an age of the memory device, one more other parameters, or any combination thereof. The dynamic threshold generator 626 may include a LUT such as the LUT 104 of FIG. 1. Alternatively, or in addition, the dynamic threshold generator 626 may include circuitry configured to perform calculations based on values of one or more of the parameters 622 to generate one or more of the dynamic thresholds 630.

Figure 7:
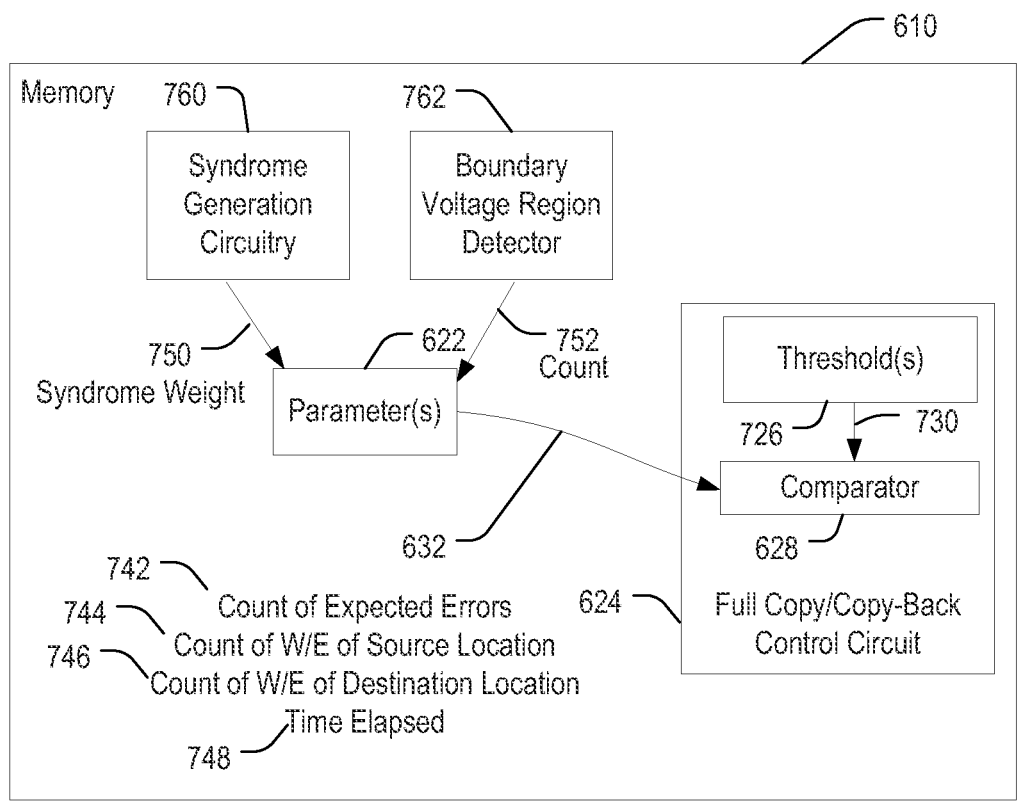
FIG. 7 is a block diagram of the memory of the system of FIG. 6 including a second embodiment of the full copy/copy-back control circuit configured to select a full copy or a copy-back based on one or more parameters.

FIG. 7 is a block diagram of another embodiment of the memory 610 of FIG. 6 including an embodiment of the full copy/copy-back control circuit 624 configured to select a full copy or a copy-back based on one or more of the parameters 622. As an example, the predefined parameter 632 may include one or more a count of expected errors in the data 742, a count of write/erase cycles 744 of the first group of storage elements in the source location 616, a count of write/erase 746 cycles of the second group of storage elements in the destination location 618, and a time elapsed 748 since the data was programmed to the first group of storage elements.

The count of expected errors 742 may be generated according to a syndrome generation, according to a threshold voltage region detection, or a combination thereof. To illustrate, the memory 610 may include syndrome generation circuitry 760. The syndrome generation circuitry 760 may be configured to perform multiple parity check computations on data read from the source location 616 and to generate a syndrome or other information indicating parity check status. The memory 610 may be configured to initiate a syndrome generation operation at the syndrome generation circuitry 760 in the memory die. The count of expected errors 742 may be determined based on a syndrome or other information 750 (e.g. a syndrome weight) that is computed in the memory die by the syndrome generation circuitry 760.

Alternatively, or in addition, the storage elements of the first group of storage elements in the source location 616 may be flash memory cells and the count of expected errors 742 may be determined based on a count 752 of flash memory cells within the first group of storage elements having threshold voltages within a set of state boundary voltage regions. For example, each state boundary voltage region of the set of state boundary voltage regions may correspond to a voltage range that includes a transition voltage that identifies a boundary between states of a set of programmable flash memory cell states, such as described with respect to FIG. 5. The memory 610 may include a boundary voltage region detector 762 that is configured to generate the count 752.

The full copy/copy-back circuit 624 may include a threshold generator or storage 726 that is accessible to the comparator 628 to enable comparisons of one or more thresholds 730 to one or more of the predefined parameters 632. One or more of the thresholds 730 may be predetermined values that are not dynamically selected or computed. Alternatively, or in addition, one or more of the thresholds 730 may be dynamically determined (e.g. retrieved from a LUT or computed) as described with respect to FIG. 6.

Although FIG. 7 illustrates the memory 610 including the syndrome generation circuit 760 and the boundary voltage region detector 762, in other embodiments the memory 610 does not include the syndrome generation circuit 760, such as when the count of expected errors 742 is determined based on factors other than syndrome information. In other embodiments, the memory 610 does not include the boundary voltage region detector 762, such as when the count of expected errors 742 is determined based on factors other than a count of cells having a threshold voltage in a set of boundary regions. In some embodiments, the memory 610 does not include the syndrome generation circuit 760 and also does not include the boundary voltage region detector 762. For example, a full copy/copy-back determination may be made without determining the count of expected errors 742, or by determining the count of expected errors 742 based on other mechanisms.

Figure 8:
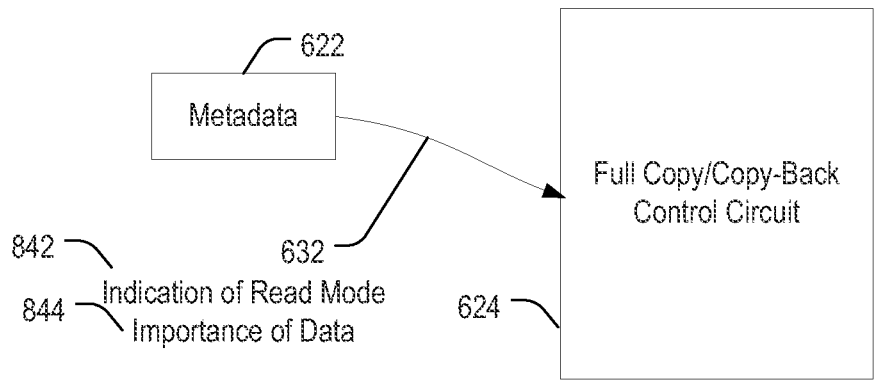
FIG. 8 is a block diagram of a third embodiment of the full copy/copy-back control circuit of FIG. 6 configured to select a full copy or a copy-back based on metadata.

FIG. 8 is a block diagram of another embodiment of the full copy/copy-back control circuit 624 of FIG. 6 configured to select a full copy or a copy-back based on metadata 622. The metadata 622 can include an indication of a read mode 842, an indication of an importance of the data to be copied 844, or an indication of the data retention specification of the data to be copied (i.e. how much storage time is provided while still ensuring that the data can be reliably read) or any combination thereof.

For example, the memory 610 may be configured to sense states of memory cells according to a first read mode and according to a second read mode. The first read mode may correspond to a higher reading resolution than the second read mode. For example, the first read mode may include use of soft bits and the second read mode may include reading of hard bits without reading soft bits (or reading fewer soft bits than the first read mode). The full copy/copy-back control circuit 624 may be configured to select a full copy or a copy-back based on whether the metadata 622 indicates the first read mode. To illustrate, when the metadata 622 indicates the first read mode, a full copy may be selected, while when the metadata 622 indicates the second read mode, a copy-back may be selected.

As another example, full copy/copy-back control circuit 624 may be configured to select a full copy or a copy-back based on whether the metadata 622 indicates that the data has a high importance or whether the data is associated with a higher data retention specification. To illustrate, when the metadata 622 indicates a high importance, a full copy may be selected, while when the metadata 622 does not indicate a high importance, a copy-back may be selected.

It should be understood that the full copy/copy-back control circuit 624 may perform a combination of the functions described with respect to FIGS. 6-8. For example, the full copy/copy-back control circuit 624 may base a determination of whether to perform a full copy or a copy-back on comparing a first parameter to a dynamic threshold, comparing a second parameter to a static threshold, and examining metadata for indications of read mode and/or importance.

Figure 9:
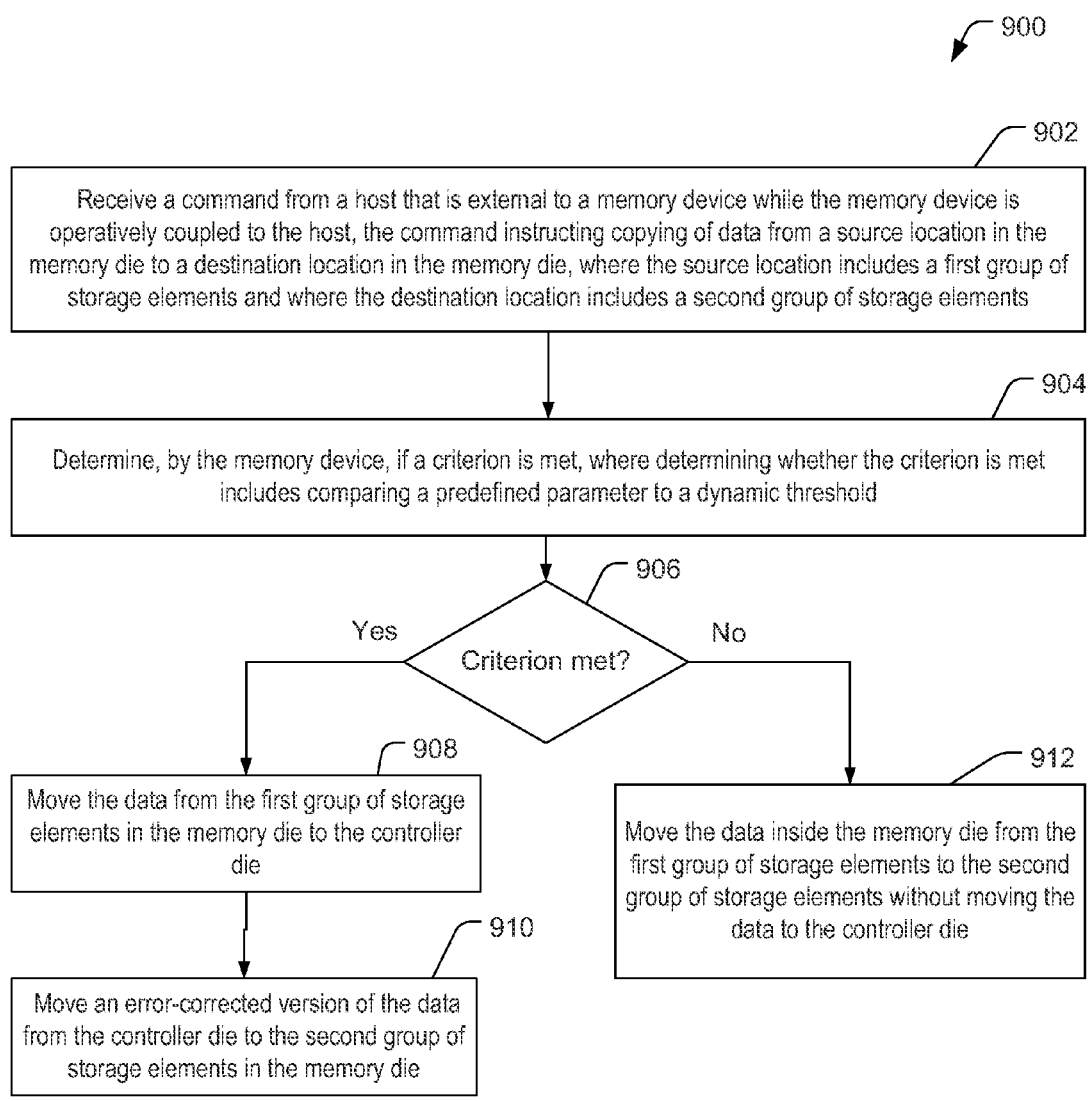
FIG. 9 is a flow chart of a fourth particular embodiment of a method of determining whether to perform a full copy or a copy-back.

FIG. 9 is a flow chart of a method 900 of copying data. The method 900 can be performed in a memory device with a controller die and a memory die, such as the data storage device 602 of FIG. 6. The method 900 includes receiving a command from a host (or from the controller die during memory management, e.g. as part of garbage collection) that is external to the memory device while the memory device is operatively coupled to the host, the command instructing copying of data from a source location in the memory die to a destination location in the memory die, where the source location includes a first group of storage elements and where the destination location includes a second group of storage elements, at 902. For example, the data storage device 602 may receive the command 606 from the host device 604.

The memory device determines if a criterion is met, where determining whether the criterion is met includes comparing a predefined parameter to a dynamic threshold, at 904. For example, the full copy/copy back circuit 624 may compare one or more predefined parameters 632 to one or more thresholds to determine whether the criterion is met. As an illustration, the criterion may be that a count of copy-back operations that have been performed to the data to be copied (since a last full copy of the data) exceeds a copy-back threshold. The copy-back threshold may be determined by performing a lookup operation at the LUT 104 of FIG. 1 using a parameter indicating an age of the memory 610 of the data storage device 602 and using a parameter indicating a number of W/E cycles of the source location of the data. Determining whether the criterion is met may further include comparing a second predefined parameter to a second dynamic threshold.

In response to determining that the criterion is met, at 906, the memory device executes the copying by performing a full copy. The data is moved from the first group of storage elements in the memory die to the controller die, at 908. After moving the data to the controller die, an error-corrected version of the data is moved from the controller die to the second group of storage elements in the memory die, at 910. For example, the error-corrected version may be received from the controller to a data register, such as the data register 620 of FIG. 6, and copied from the data register to the destination location.

In response to determining that the criterion is not met, at 906, the memory device executes the copying by performing a copy-back. The data is moved inside the memory die from the first group of storage elements to the second group of storage elements without moving the data to the controller die, at 912. For example, the data may be written from the source location to a data register, such as the data register 620 of FIG. 6, and copied from the data register to the destination location.

The predefined parameter may be a count of expected errors in the data. For example, the method 900 may include initiating a syndrome generation operation at syndrome generation circuitry in the memory die, such as the syndrome generation circuitry 760 of FIG. 7. The count of expected errors may be determined based on a syndrome that is computed in the memory die by the syndrome generation circuitry. As another example, the storage elements of the first group of storage elements may be flash memory cells and the count of expected errors may be determined based on a count of flash memory cells within the first group of storage elements having threshold voltages within a set of state boundary voltage regions. Each state boundary voltage region of the set of state boundary voltage regions may correspond to a voltage range that includes a transition voltage that identifies a boundary between states of a set of programmable flash memory cell states, such as described with respect to FIG. 5.

The predefined parameter may be a count of write/erase cycles of the first group of storage elements, a count of write/erase cycles of the second group of storage elements, a time elapsed since the data was programmed to the first group of storage elements, a count of copy-back operations that have been applied to the data since applying a most recent error correction operation to the data, a count of parity bits in the data, or one or more other parameters.

The dynamic threshold may be determined at least partially based on a count of copy-back operations that have been applied to the data since applying a most recent error correction operation to the data, at least partially based on a count of write/erase cycles of the first group of storage elements, at least partially based on a count of write/erase cycles of the second group of storage elements, at least partially based on a count of errors in the data detected during a previous copy of the data via the controller die, at least partially based on an age of the memory device, at least partially based on one or more other parameters, or any combination thereof.

The method 900 may also update a count of direct copies of the source location, such as a value of the copy-back counter CB in FIGS. 3-4. In response to determining that the criterion is met, the count of direct copies may be reset (because a full copy is performed). In response to determining that the criterion is not met, the count of direct copies may be incremented.

The method 900 may also include updating an accumulated error value in response to one or more errors being corrected in the controller die. For example, a value of Max-Err in FIGS. 3-4 may be increased in response to the number of errors that are corrected exceeding a current value of Max-Err. As another example, if an accumulated error value is computed based on an average number of errors or a median of the number of errors, the accumulated error value may be updated to include results from the correction of errors during the full copy operation.

Figure 10:
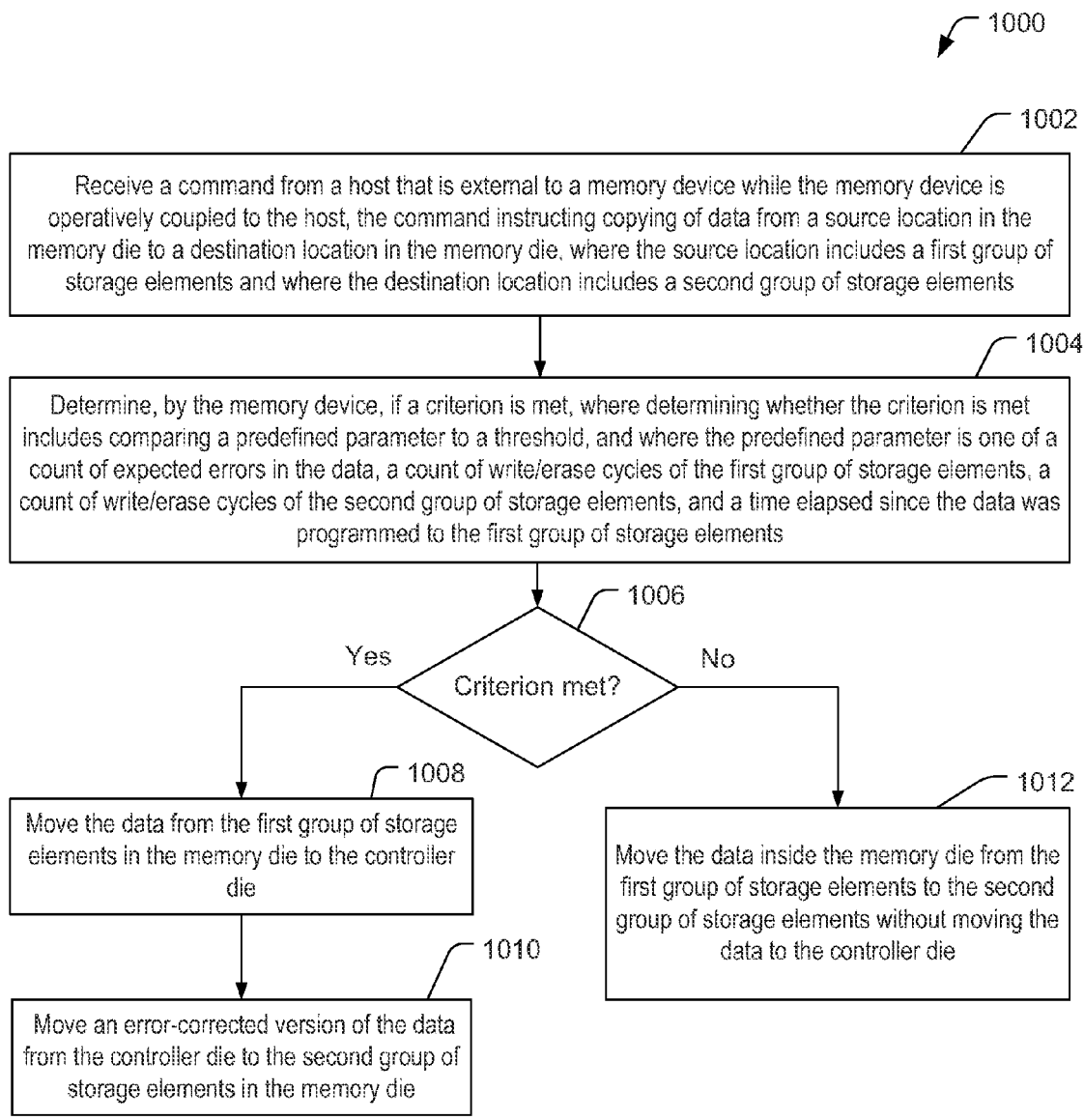
FIG. 10 is a flow chart of a fifth particular embodiment of a method of determining whether to perform a full copy or a copy-back.

FIG. 10 is a flow chart of a method 1000 of copying data. The method 1000 may be performed in a memory device with a controller die and a memory die, such as the data storage device 602 of FIG. 6 including the memory 610 of FIG. 7. The method 1000 includes receiving a command from a host that is external to the memory device while the memory device is operatively coupled to the host, the command instructing copying of data from a source location in the memory die to a destination location in the memory die, where the source location includes a first group of storage elements and where the destination location includes a second group of storage elements, at 1002.

The memory device determines if a criterion is met, where determining whether the criterion is met includes comparing a predefined parameter to a threshold, and where the predefined parameter is one of a count of expected errors in the data, a count of write/erase cycles of the first group of storage elements, a count of write/erase cycles of the second group of storage elements, and a time elapsed since the data was programmed to the first group of storage elements, at 1004.

In response to determining that the criterion is met, at 1006, the memory device executes the copying by performing a full copy. The data is moved from the first group of storage elements in the memory die to the controller die, at 1008. After moving the data to the controller die, an error-corrected version of the data is moved from the controller die to the second group of storage elements in the memory die, at 1010. For example, the error-corrected version may be received from the controller to a data register, such as the data register 620 of FIG. 6, and copied from the data register to the destination location.

In response to determining that the criterion is not met, at 1006, the memory device executes the copying by performing a copy-back. The data is moved inside the memory die from the first group of storage elements to the second group of storage elements without moving the data to the controller die, at 1012. For example, the data may be written from the source location to a data register, such as the data register 620 of FIG. 6, and copied from the data register to the destination location.

The threshold may be predefined or the threshold may be dynamic. A dynamic threshold may be computed based on at least one of a count of copy-back operations that have been applied to the data since applying a most recent error correction operation to the data, the count of write/erase cycles of the first group of storage elements, the count of write/erase cycles of the second group of storage elements, and a count of errors in the data detected during a previous copy of the data via the controller die.

Figure 11:
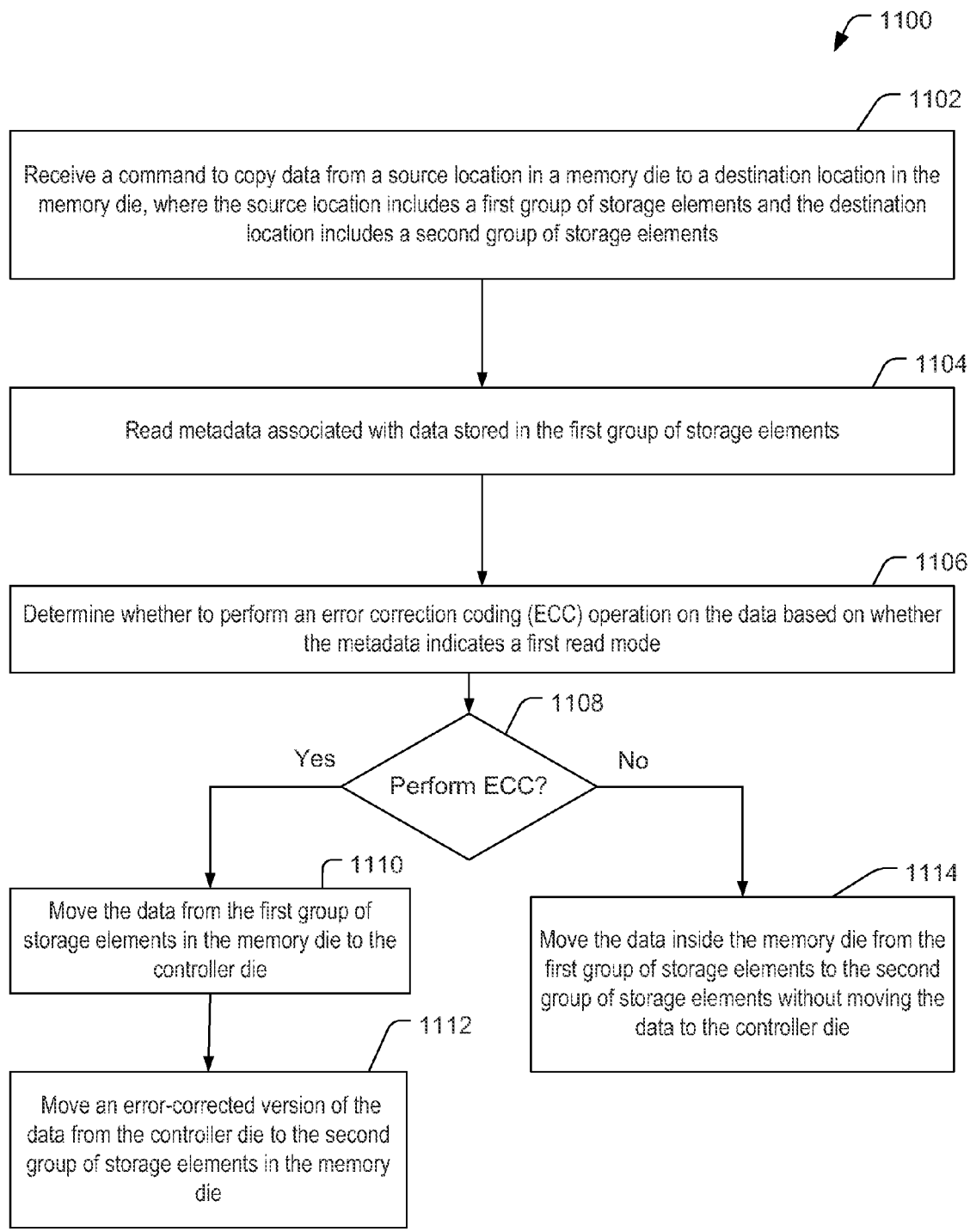
FIG. 11 is a flow chart of a sixth particular embodiment of a method of determining whether to perform a full copy or a copy-back.

FIG. 11 is a flow chart a method 1100 of copying data. The method 1100 may be performed in a memory device with a controller die and a memory die, such as the data storage device 602 of FIG. 6. The memory die may be configured to sense states of memory cells according to a first read mode and according to a second read mode, where the first read mode corresponds to a higher reading resolution than the second read mode, as described with respect to FIG. 8. The memory device receives a command to copy data from a source location in the memory die to a destination location in the memory die, wherein the source location includes a first group of storage elements and where the destination location includes a second group of storage elements, at 1102.

Metadata associated with data stored in the first group of storage elements is read, at 1104. For example, the metadata may be read from a header portion or metadata portion of memory associated with the first group of storage elements. The memory device determines whether to perform an error correction coding (ECC) operation on the data based on whether the metadata indicates the first read mode, at 1106.

In response to determining to perform the ECC operation, at 1108, the memory device may execute the copying by performing a full copy. The data may be moved from the first group of storage elements in the memory die to the controller die, at 1110. After moving the data to the controller die, an error-corrected version of the data may be moved from the controller die to the second group of storage elements in the memory die, at 1112. For example, the error-corrected version may be received from the controller to a data register, such as the data register 620 of FIG. 6, and copied from the data register to the destination location.

In response to determining not to perform the ECC operation, at 1108, the memory device may execute the copying by performing a copy-back. The data may be moved inside the memory die from the first group of storage elements to the second group of storage elements without moving the data to the controller die, at 1114. For example, the data may be written from the source location to a data register, such as the data register 620 of FIG. 6, and copied from the data register to the destination location.

Figure 12:
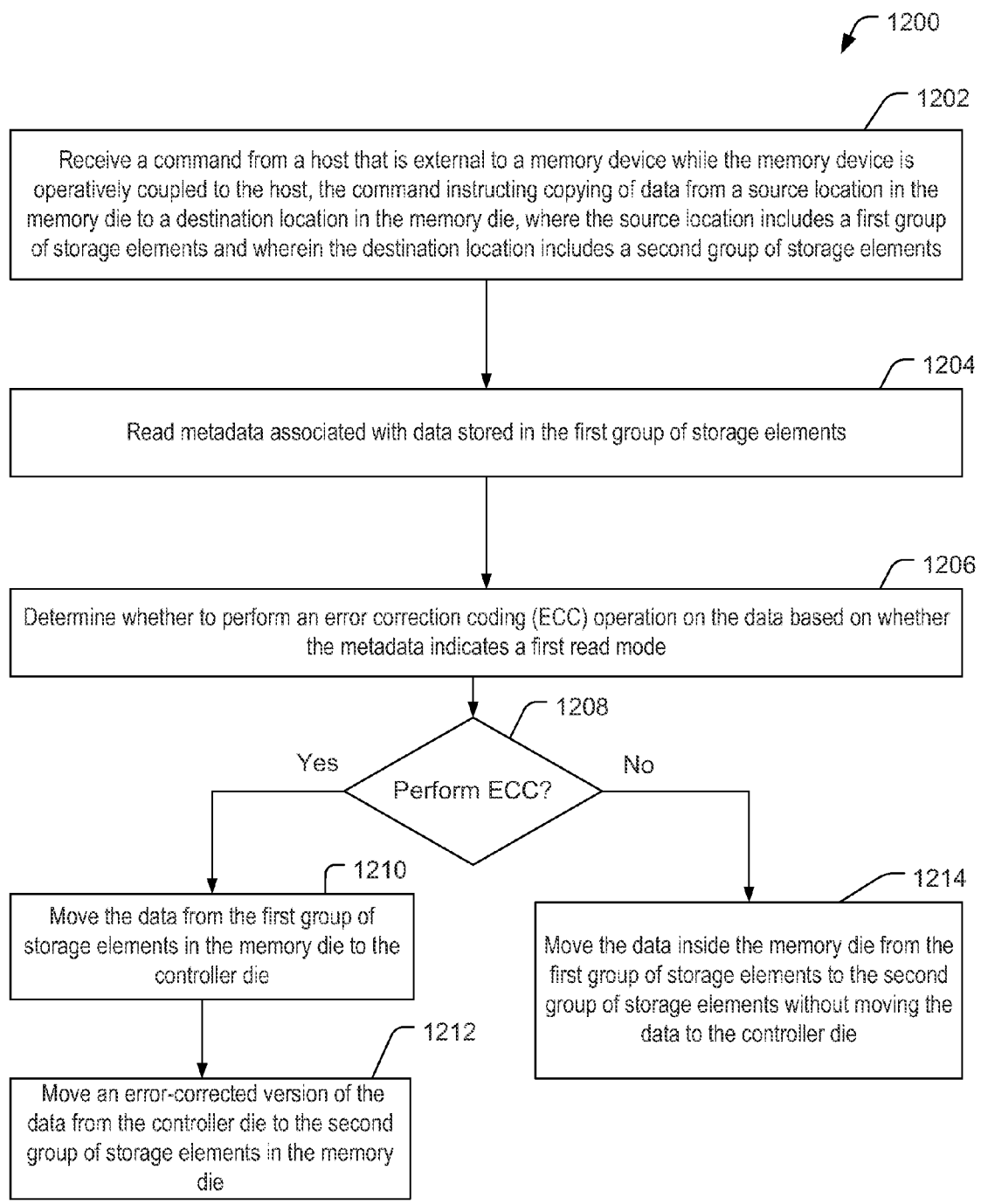
FIG. 12 is a flow chart of a seventh particular embodiment of a method of determining whether to perform a full copy or a copy-back.

FIG. 12 is a flow chart a method 1200 of copying data. The method 1200 may be performed in a memory device with a controller die and a memory die, such as the data storage device 602 of FIG. 6. The memory device receives a command to copy data from a source location in the memory die to a destination location in the memory die, wherein the source location includes a first group of storage elements and where the destination location includes a second group of storage elements, at 1202.

Metadata associated with data stored in the first group of storage elements is read, at 1204. For example, the metadata may be read from a header portion or metadata portion of memory associated with the first group of storage elements. The memory device determines whether to perform an error correction coding (ECC) operation on the data based on whether the metadata indicates that the data has a high importance, at 1206.

In response to determining to perform the ECC operation, at 1208, the memory device may execute the copying by performing a full copy. The data may be moved from the first group of storage elements in the memory die to the controller die, at 1210. After moving the data to the controller die, an error-corrected version of the data may be moved from the controller die to the second group of storage elements in the memory die, at 1212. For example, the error-corrected version may be received from the controller to a data register, such as the data register 620 of FIG. 6, and copied from the data register to the destination location.

In response to determining not to perform the ECC operation, at 1208, the memory device may execute the copying by performing a copy-back. The data may be moved inside the memory die from the first group of storage elements to the second group of storage elements without moving the data to the controller die, at 1214. For example, the data may be written from the source location to a data register, such as the data register 620 of FIG. 6, and copied from the data register to the destination location.

FIGS. 11-12 may correspond to a method of copying data that includes receiving a command to copy data from a source location in the memory die to a destination location in the memory die and reading metadata associated with stored data at the source location. The metadata may be independent of a number of times the stored data has been copied within the memory die without performing error correction processing. A determination is made whether to perform an error correction coding (ECC) operation on the stored data based on the metadata.

For example, determining whether to perform the ECC operation may include determining to perform the ECC operation in response to the metadata indicating the stored data has a high importance. As another example, the memory die may be configured to sense states of memory cells according to a first read mode and according to a second read mode. The first read mode may correspond to a higher reading resolution than the second read mode. Determining whether to perform the ECC operation may include determining to perform the ECC operation in response to the metadata indicating the first read mode.

In response to determining to perform the ECC operation, the method may include moving the stored data from the memory die to the controller die and, after moving the stored data to the controller die, moving an error-corrected version of the stored data from the controller die to the memory die. In response to determining to not perform the ECC operation, the method may include moving the data inside the memory die from the source location to the destination location without moving the data to the controller die.

Although various components depicted herein are illustrated as block components and described in general terms, such components may include one or more microprocessors, state machines, or other circuits configured to enable a data storage device, such as the data storage device 602 of FIG. 6, to perform the particular functions attributed to such components, or any combination thereof. For example, the full copy/copy-back control circuit 624 may represent physical components, such as controllers, state machines, logic circuits, or other structures to instruct the memory 610 to perform a full copy operation or a copy-back operation.

The full copy/copy-back control circuit 624 may be implemented using a microprocessor or microcontroller programmed to determine whether to perform a full copy operation or a copy-back operation based on one more comparisons of parameters to static or dynamic thresholds, based on examining metadata associated with the data, or a combination thereof. In a particular embodiment, the full copy/copy-back control circuit 624 includes a processor executing instructions that are stored at the memory 610. Alternatively, or in addition, executable instructions that are executed by the processor may be stored at a separate memory location that is not part of the memory 610, such as at a read-only memory (ROM) (not shown).

In a particular embodiment, the data storage device 602 may be a portable device configured to be selectively coupled to one or more external devices. However, in other embodiments, the data storage device 602 may be attached or embedded within one or more host devices, such as within a housing of a portable communication device. For example, the data storage device 602 may be within a packaged apparatus, such as a wireless telephone, a personal digital assistant (PDA), gaming device or console, a portable navigation device, or other device that uses internal non-volatile memory. In a particular embodiment, the data storage device 602 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the FIGs. are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of copying data, the method comprising:
   in a memory device with a controller die and a memory die, performing:
   receiving a command from a host that is external to the memory device, the command instructing copying of data from a source location in the memory die to a destination location in the memory die, wherein a first group of storage elements corresponds to the source location and a second group of storage elements corresponds to the destination location;
   determining by the memory device if a criterion is met, wherein determining whether the criterion is met includes comparing a parameter to a dynamic threshold, wherein a value of the dynamic threshold is determined by performing a table look-up operation that includes a write/erase count and an elapsed time;

in response to determining that the criterion is met:
moving the data from the first group of storage elements in the memory die to the controller die, and after moving the data to the controller die, performing an error correction coding (ECC) operation on the data to generate error-corrected data and moving the error-corrected data from the controller die to the second group of storage elements in the memory die; and in response to determining that the criterion is not met, executing the copying by moving the data inside the memory die from the first group of storage elements to the second group of storage elements without moving the data to the controller die.

2. The method of claim 1, wherein determining whether the criterion is met further includes comparing a second parameter to a second dynamic threshold.

3. The method of claim 1, wherein the parameter corresponds to a count of expected errors in the data.

4. The method of claim 3, further comprising initiating a syndrome generation operation at syndrome generation circuitry in the memory die, wherein the count of expected errors is determined based on a syndrome that is computed in the memory die by the syndrome generation circuitry.

5. The method of claim 4, wherein the syndrome generation operation generates a syndrome weight based on multiple parity check computations.

6. The method of claim 4, wherein the syndrome generation operation generates a syndrome weight at least partly based on a number of unsatisfied parity check equations.

7. The method of claim 3, wherein the storage elements of the first group of storage elements are flash memory cells and wherein the count of expected errors is determined based on a count of flash memory cells within the first group of storage elements having threshold voltages within a set of state boundary voltage regions, each state boundary voltage region of the set of state boundary voltage regions corresponding to a voltage range that includes a transition voltage that identifies a boundary between states of a set of programmable flash memory cell states.

8. The method of claim 1, wherein the dynamic threshold is determined at least partially based on a count of copy-back operations that have been applied to the data since applying a most recent error correction operation to the data.

9. The method of claim 1, wherein the write/erase count corresponds to a count of write/erase cycles of the first group of storage elements.

10. The method of claim 1, wherein the write/erase count corresponds to a count of write/erase cycles of the second group of storage elements.

11. The method of claim 1, wherein the dynamic threshold is determined at least partially based on a count of errors in the data detected during a previous copy of the data via the controller die.

12. The method of claim 1, wherein the elapsed time corresponds to an age of the memory device.

13. The method of claim 1, further comprising, in response to determining the criterion is met, generating a value of a dynamic threshold, and wherein the value of the dynamic threshold is used to determine if the criterion is met in response to receiving a next data copy command.

14. The method of claim 13, further comprising generating the dynamic threshold by:
estimating a bit error probability corresponding to a single copy-back operation;
estimating a largest positive integer k of copy-back operations that can be performed without a resultant bit error probability that is introduced by the k copy-back operations exceeding a bit error probability threshold; and
setting the value of the dynamic threshold to k.

15. The method of claim 1, wherein the elapsed time comprises a measure proportional to an elapsed time since a programming event.

16. A method of copying data, the method comprising:
in a memory device with a controller die and a memory die, performing:
receiving a command from a host that is external to the memory device, the command instructing copying of data from a source location in the memory die to a destination location in the memory die, wherein a first group of storage elements corresponds to the source location and a second group of storage elements corresponds to the destination location;
determining by the memory device if a criterion is met, wherein determining whether the criterion is met includes comparing a parameter to a threshold, the threshold determined based on a historical record of corrected errors;
in response to determining that the criterion is met:
moving the data from the first group of storage elements to the controller die, and
after moving the data to the controller die, performing an error correction coding (ECC) operation on the data to generate error-corrected data and moving the error-corrected data from the controller die to the second group of storage elements; and
in response to determining that the criterion is not met, executing the copying by moving the data inside the memory die from the first group of storage elements to the second group of storage elements without moving the data to the controller die.

17. The method of claim 16, wherein determining whether the criterion is met further includes comparing a second parameter to a second threshold, wherein the second parameter is one of a count of write/erase cycles of the first group of storage elements, a count of write/erase cycles of the second group of storage elements, or a time elapsed since the data was programmed to the first group of storage elements.

18. The method of claim 16, wherein the threshold is dynamic and is computed based on
a count of errors in the data detected during a previous copy of the data via the controller die.

19. The method of claim 16, further comprising updating the threshold by:
accessing a historical record of numbers of corrected errors in codewords;
generating a histogram based on the numbers of corrected errors; and
updating a value of the threshold based on the histogram.

20. The method of claim 16, further comprising updating the threshold by:
accessing historical data indicating a largest detected number of corrected errors in codewords; and
in response to the largest detected number of corrected errors exceeding an error threshold, increasing a value of the threshold.

21. A method of copying data, the method comprising:
in a memory device with a controller die and a memory die, wherein the memory die is configured to sense states of memory cells according to a first read mode and according to a second read mode, wherein the first read mode corresponds to a higher reading resolution than the second read mode, performing:

receiving a command to copy data from a source location in the memory die to a destination location in the memory die, wherein the source location includes a first group of storage elements and wherein the destination location includes a second group of storage elements;

reading metadata associated with data stored in the first group of storage elements; and determining whether to perform an error correction coding (ECC) operation on the data based on whether the metadata indicates the first read mode.

22. The method of claim 21, further comprising, in response to determining to perform the ECC operation:

moving the data from the first group of storage elements to the controller die; and after moving the data to the controller die, moving an error-corrected version of the data from the controller die to the second group of storage elements.

23. The method of claim 21, further comprising, in response to determining to not perform the ECC operation, moving the data inside the memory die from the first group of storage elements to the second group of storage elements without moving the data to the controller die.

24. A method of copying data, the method comprising:

in a memory device with a controller die and a memory die, performing:

receiving a command to copy data from a source location in the memory die to a destination location in the memory die, wherein the source location includes a first group of storage elements and wherein the destination location includes a second group of storage elements;

reading metadata associated with data stored in the first group of storage elements; and determining whether to perform an error correction coding (ECC) operation on the data based on whether the metadata indicates that the data has a high importance.

25. The method of claim 24, further comprising, in response to determining to perform the ECC operation:

moving the data from the first group of storage elements to the controller die; and after moving the data to the controller die, moving an error-corrected version of the data from the controller die to the second group of storage elements.

26. The method of claim 24, further comprising, in response to determining to not perform the ECC operation, moving the data inside the memory die from the first group of storage elements to the second group of storage elements without moving the data to the controller die.

27. A method of copying data, the method comprising:

in a memory device with a controller die and a memory die, performing:

receiving a command to copy data from a source location in the memory die to a destination location in the memory die;

reading metadata associated with stored data at the source location, the metadata being independent of a number of times the stored data has been copied within the memory die without performing error correction processing; and determining whether to perform an error correction coding (ECC) operation on the stored data based on the metadata.

28. The method of claim 27, further comprising, in response to determining to perform the ECC operation:

moving the stored data from the memory die to the controller die; and after moving the stored data to the controller die, moving an error-corrected version of the stored data from the controller die to the memory die.

29. The method of claim 27, further comprising, in response to determining to not perform the ECC operation, moving the data inside the memory die from the source location to the destination location without moving the data to the controller die.

30. The method of claim 27, wherein the memory die is configured to sense states of memory cells according to a first read mode and according to a second read mode, wherein the first read mode corresponds to a higher reading resolution than the second read mode, and wherein determining whether to perform the ECC operation includes determining to perform the ECC operation in response to the metadata indicating the first read mode.

31. The method of claim 27, wherein determining whether to perform the ECC operation includes determining to perform the ECC operation in response to the metadata indicating the stored data has a high importance.

32. The method of claim 27, wherein determining whether to perforin the ECC operation includes determining to perform the ECC operation in response to the metadata indicating the stored data has a high data retention specification.

33. A data storage device comprising:

a controller die; and a memory die including a first group of storage elements and a second group of storage elements, wherein the controller die is configured to instruct copying of data from a source location in the memory die to a destination location in the memory die, wherein the first group of storage elements corresponds to the source location and the second group of storage elements corresponds to the destination location, wherein the data storage device is configured to determine if a criterion is met at least partially based in a comparison of a parameter to a dynamic threshold, wherein a value of the dynamic threshold is determined by performing a table look-up operation that includes a write/erase count and an elapsed time, wherein in response to determining that the criterion is met, the data storage device is configured to execute the copying by moving the data from the first group of storage elements in the memory die to the controller die and, after moving the data to the controller die, performing an error correction coding (ECC) operation on the data and moving an error-corrected version of the data from the controller die to the second group of storage elements in the memory die, and wherein in response to determining that the criterion is not met, the data storage device is configured to execute the copying by moving the data inside the memory die from the first group of storage elements to the second group of storage elements without moving the data to the controller die.

34. The data storage device of claim 33, wherein the memory includes a copy control circuit configured to determine if the criterion is met.

35. The data storage device of claim 34, wherein the copy control circuit includes a dynamic threshold generator coupled to a comparator.

36. The data storage device of claim 33, wherein the parameter is a count of expected errors in the data.

37. The data storage device of claim 36, wherein the memory die includes syndrome generation circuitry and wherein the count of expected errors is determined based on a syndrome that is computed by the syndrome generation circuitry.

38. The data storage device of claim 36, wherein the storage elements of the first group of storage elements are flash memory cells, wherein the memory die includes a boundary voltage region detector configured to generate a count of flash memory cells within the first group of storage elements having threshold voltages within a set of state boundary voltage regions, wherein each state boundary voltage region of the set of state boundary voltage regions corresponds to a voltage range that includes a transition voltage that identifies a boundary between states of a set of programmable flash memory cell states, and wherein the count of expected errors is determined based on the count of flash memory cells within the first group of storage elements having threshold voltages within the set of state boundary voltage regions.

39. The data storage device of claim 33, wherein the parameter is a count of write/erase cycles of the first group of storage elements.

40. The data storage device of claim 33, wherein the parameter is a count of write/erase cycles of the second group of storage elements.

41. The data storage device of claim 33, wherein the parameter is a time elapsed since the data was programmed to the first group of storage elements.

42. The data storage device of claim 33, wherein the parameter is a count of copy-back operations that have been applied to the data since applying a most recent error correction operation to the data.

43. The data storage device of claim 33, wherein the parameter is a count of parity bits in the data.

44. The data storage device of claim 33, wherein determining whether the criterion is met further includes comparing a second parameter to a second threshold.

45. The data storage device of claim 44, wherein the second threshold is determined at least partially based on one of a count of write/erase cycles of the first group of storage elements or a count of copy-back operations that have been applied to the data since applying a most recent error correction operation to the data.

46. The data storage device of claim 44, wherein the second threshold is determined at least partially based on a count of write/erase cycles of the second group of storage elements.

47. The data storage device of claim 44, wherein the second threshold is determined at least partially based on a count of errors in the data detected during a previous copy of the data via the controller die.

48. The data storage device of claim 44, wherein the second threshold is determined at least partially based on an age of the memory die.

49. The data storage device of claim 33, wherein the data storage device is configured to update a count of direct copies of the source location by:
in response to determining that the criterion is met, resetting the count of direct copies, and
in response to determining that the criterion is not met, incrementing the count of direct copies.

50. The data storage device of claim 33, wherein the data storage device is configured to update an accumulated error value in response to one or more errors being corrected in the controller die.

51. A data storage device comprising:
a controller die; and
a memory die including a first group of storage elements and a second group of storage elements,
wherein the controller die is configured to instruct copying of data from a source location in the memory die to a destination location in the memory die, wherein a first group of storage elements corresponds to the source location and wherein a second group of storage elements corresponds to the destination location,
wherein the data storage device is configured to determine if a criterion is met at least partially based on a comparison of a parameter to a threshold, the threshold determined based on a historical record of corrected errors,
wherein in response to determining that the criterion is met, the data storage device is configured to execute the copying by moving the data from the first group of storage elements in the memory die to the controller die and, after moving the data to the controller die, performing an error correction coding (ECC) operation on the data and moving an error-corrected version of the data from the controller die to the second group of storage elements in the memory die, and
wherein in response to determining that the criterion is not met, the data storage device is configured to execute the copying by moving the data inside the memory die from the first group of storage elements to the second group of storage elements without moving the data to the controller die.

52. The data storage device of claim 51, wherein determining whether the criterion is met further includes comparing a second parameter to a second threshold, wherein the second parameter is one of a count of write/erase cycles of the first group of storage elements, a count of write/erase cycles of the second group of storage elements, or a time elapsed since the data was programmed to the first group of storage elements.

53. The data storage device of claim 51, wherein the threshold is dynamic and is computed based on
a count of errors in the data detected during a previous copy of the data via the controller die.

54. A data storage device comprising:
a controller die; and
a memory die, wherein the memory die is configured to sense states of memory cells according to a first read mode and according to a second read mode, wherein the first read mode corresponds to a higher reading resolution than the second read mode, and wherein the memory die includes a first group of storage elements and a second group of storage elements,
wherein the memory die is configured, in response to receiving a command from the controller to copy data from a source location that corresponds to the first group of storage elements to a destination location that corresponds to the second group of storage elements, to read metadata associated with the data stored in the first group of storage elements and to determine whether to perform an error correction coding (ECC) operation on the data based on whether the metadata indicates the first read mode.

55. The data storage device of claim 54, wherein in response to determining to perform the ECC operation, the data storage device is configured to move the data from the first group of storage elements to the controller die and, after moving the data to the controller die, move an error-corrected version of the data from the controller die to the second group of storage elements.

56. The data storage device of claim 54, wherein in response to determining to not perform the ECC operation, the data storage device is configured to move the data inside the memory die from the first group of storage elements to the second group of storage elements without moving the data to the controller die.

57. A data storage device comprising:
a controller die; and
a memory die that includes a first group of storage elements and a second group of storage elements,
wherein the memory die is configured, in response to receiving a command from the controller die to copy data from a source location that corresponds to the first group of storage elements to a destination location that corresponds to the second group of storage elements, to read metadata associated with the data stored in the first group of storage elements and to determine whether to perform an error correction coding (ECC) operation on the data based on whether the metadata indicates that the data has a high importance.

58. The data storage device of claim 57, wherein in response to determining to perform the ECC operation, the data storage device is configured to move the data from the first group of storage elements to the controller die and, after moving the data to the controller die, move an error-corrected version of the data from the controller die to the second group of storage elements.

59. The data storage device of claim 57, wherein in response to determining to not perform the ECC operation, the data storage device is configured to move the data inside the memory die from the first group of storage elements to the second group of storage elements without moving the data to the controller die.

60. A data storage device comprising:
a controller die; and
a memory die that includes a first group of storage elements and a second group of storage elements,
wherein the memory die is configured, in response to receiving a command from the controller die to copy data from a source location that corresponds to the first group of storage elements to a destination location that corresponds to the second group of storage elements, to read metadata associated with the data stored in the first group of storage elements and to determine whether to perform an error correction coding (ECC) operation on the data based on the metadata, the metadata being independent of a number of times the stored data has been copied within the memory die without performing error correction processing.

61. The data storage device of claim 60, wherein the memory die is configured to sense states of memory cells according to a first read mode and according to a second read mode, wherein the first read mode corresponds to a higher reading resolution than the second read mode, and wherein determining whether to perform the ECC operation includes determining to perform the ECC operation in response to the metadata indicating the first read mode.

62. The data storage device of claim 60, wherein determining whether to perform the ECC operation includes determining to perform the ECC operation in response to the metadata indicating the stored data has a high importance.

63. The data storage device of claim 60, wherein determining whether to perform the ECC operation includes determining to perform the ECC operation in response to the metadata indicating the stored data has a high data retention specification.

* * * * *

UNITED STATES PATENT AND TRADEMARK OFFICE
CERTIFICATE OF CORRECTION

PATENT NO. : 9,158,621 B2  
APPLICATION NO. : 13/593107  
DATED : October 13, 2015  
INVENTOR(S) : Eran Sharon et al.

It is certified that error appears in the above-identified patent and that said Letters Patent is hereby corrected as shown below:

In the Claims section, Claim 32 (Column 22, Line 24) "to perforin the ECC operation includes determining to per-" should be --to perform the ECC operation includes determining to per- --.

Signed and Sealed this  
Fifth Day of April, 2016

Michelle K. Lee  
*Director of the United States Patent and Trademark Office*